United States Patent [19]

Tennyson

[11] 4,430,587
[45] Feb. 7, 1984

[54] MOS FIXED DELAY CIRCUIT

[75] Inventor: Mark R. Tennyson, Anaheim, Calif.

[73] Assignee: Rockwell International Corporation, El Segundo, Calif.

[21] Appl. No.: 339,030

[22] Filed: Jan. 13, 1982

[51] Int. Cl.³ .................... H03K 5/159; H03K 3/01
[52] U.S. Cl. ............................ 307/590; 307/605; 307/297
[58] Field of Search .......... 307/590, 594, 597, 605, 307/297

[56] References Cited

U.S. PATENT DOCUMENTS 3,921,101  11/1975  McCoy et al. ............... 307/605
4,367,422   1/1983  Leslie ......................... 307/597
4,375,596   3/1983  Hoshi .......................... 307/297

Primary Examiner—Stanley D. Miller
Assistant Examiner—B. P. Davis
Attorney, Agent, or Firm—H. Fredrick Hamann; Daniel R. McGlynn

[57] ABSTRACT

A MOS time delay circuit including a MOS regulated voltage supply circuit for supplying a voltage proportional to a predetermined trigger voltage and a RC delay circuit having a first input connected to the regulated voltage supply circuit, and a second input connected to the signal input, and an output. The circuit also includes a variable trigger point inverter having an input connected to the output of the RC delay circuit, and signal output.

2 Claims, 18 Drawing Figures

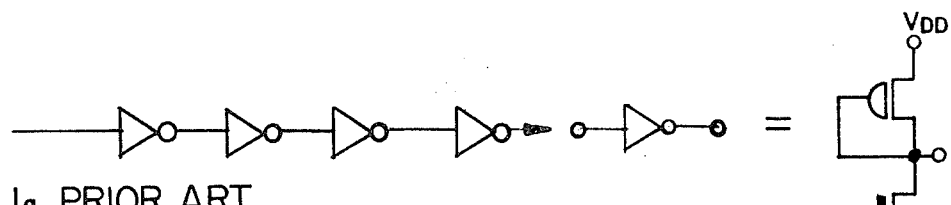
FIG.1a PRIOR ART
FIG.1b PRIOR ART
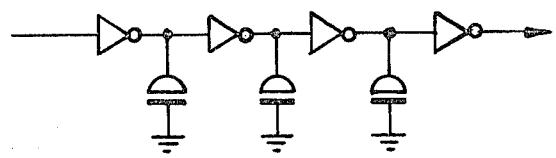
FIG.2 PRIOR ART
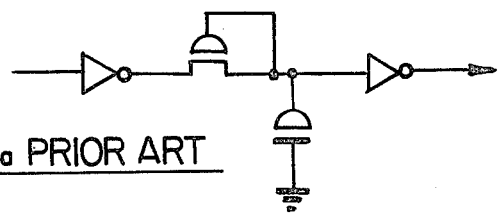
FIG.3a PRIOR ART
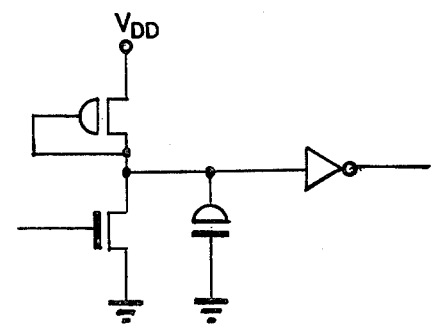
FIG.3b PRIOR ART
FIG.4a PRIOR ART
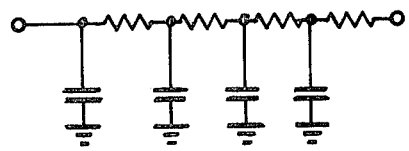
FIG.4b PRIOR ART
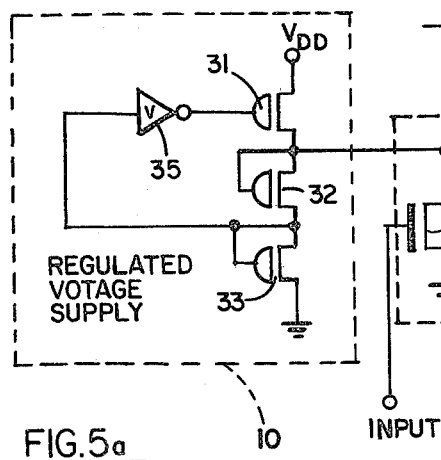
FIG.5a
INPUT
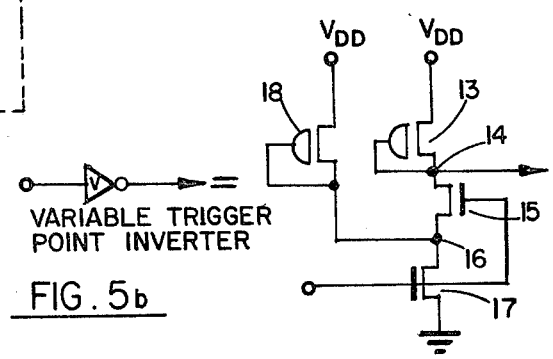
VARIABLE TRIGGER POINT INVERTER
FIG.5b

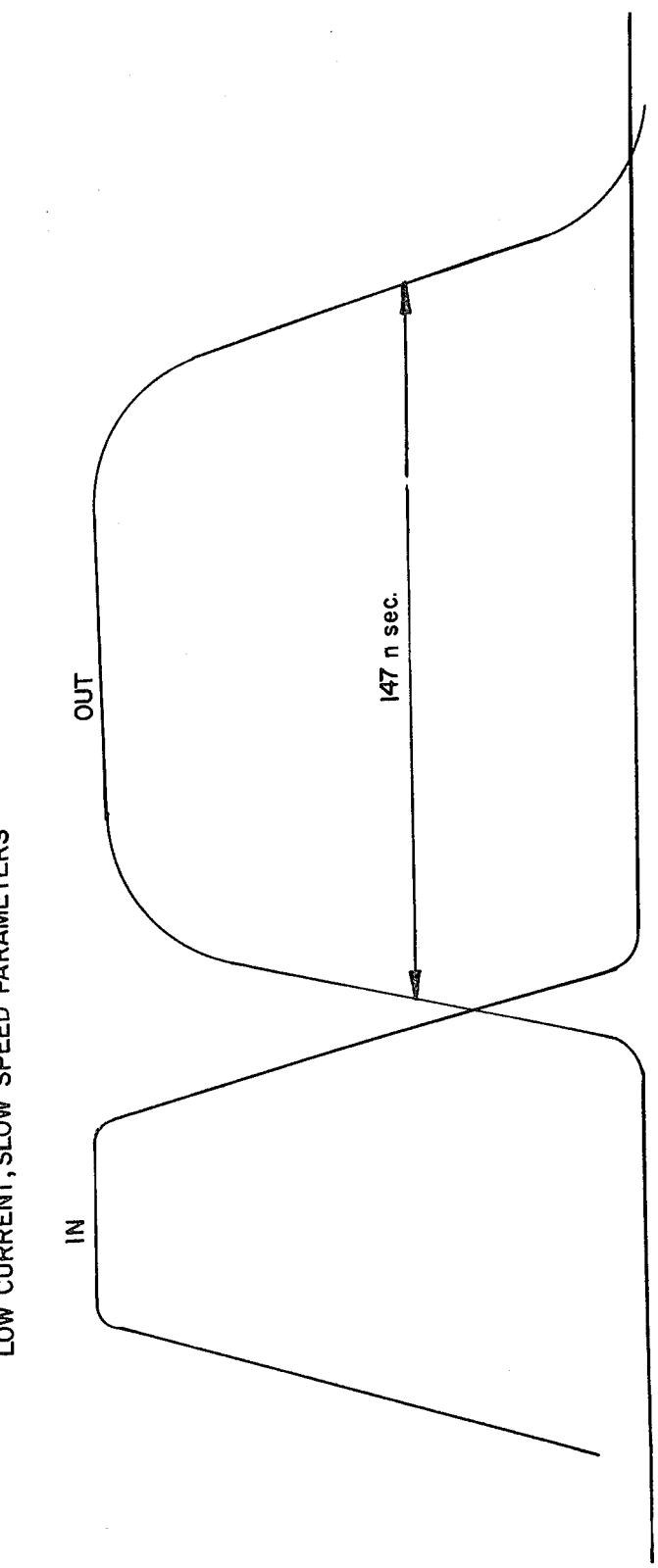

MOS FIXED DELAY CIRCUIT

BACKGROUND OF THE INVENTION

1. Field of the Invention

The invention relates to MOS circuits, and in particular to MOS circuits for producing a fixed time delay.

2. Description of the Prior Art

Fixed time delays are difficult to obtain in MOS circuits due to variations in process parameters. It is difficult to implement precision fixed capacitors and resistors in a MOS integrated circuit, thus making RC constants difficult to attain. Prior art schemes include: (1) stage delays using strings of inverters; (2) RC delays using FETs as resistors and capacitors or using N+ or poly as a distributed RC. These prior art techniques provide delays that may track logic delays in the same circuit. However, due to process variations (e.g. thresholds, mobility, N+ and poly resistivities or thickness, oxide and junction capacitances, etc.), these circuits have variations in delays of over 8 to 1. (This factor is estimated based upon computer simulations of process extremes). Sometimes a delay is required that must fit a "window" smaller than the 8:1 variation. For instance, a delay may be required that is greater than 20 ns and less than 80 ns, a range of only 4:1. Prior to the present invention it has not been possible to achieve such an accurate time delay in an MOS integrated circuit.

SUMMARY OF THE INVENTION

Briefly, and in general terms, the present invention concerns a MOS time delay circuit including a signal input; a MOS regulated voltage supply circuit for supplying a voltage proportional to a predetermined trigger voltage; a RC delay circuit having a first input connected to the regulated voltage supply circuit, and a second input connected to the signal input, and an output; and a variable trigger point inverter having an input connected to the output of said RC delay circuit, and an output.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

BRIEF DESCRIPTION OF THE DRAWINGS

FIG. 1 is an example of a circuit known in the prior art to produce a fixed time delay formed by a sequence of inverter stages;

FIG. 1b is a MOS circuit embodiment of the inverter stage utilized in the stage delay circuit in FIG. 1a;

FIG. 2 is an alternate stage delay known in the prior art with added load capacitors;

FIG. 3 is a prior art circuit for producing a fixed time delay employing RC delays using field effect transistors;

FIG. 3b is an alternative prior art fixed time delay using RC delays in which a long narrow pull-up depletion RC is utilized;

FIG. 4a is a prior art fixed time delay circuit using an RC delay using diffused or polysilicon resistors as a distributed RC circuit;

FIG. 4b is a schematic form of the distributed RC depicted in FIG. 4a;

FIG. 5a is the RC delay circuit according to the present invention;

FIG. 5b is an embodiment of the variable trigger circuit utilized in the circuit of FIG. 5a;

FIG. 8c is a timing diagram showing an input pulse applied to a stage delay circuit, and the output pulse associated therewith according to a second set of process parameters corresponding to low current, low speed parameters;

DESCRIPTION OF THE PREFERRED EMBODIMENT

Figure 5C:
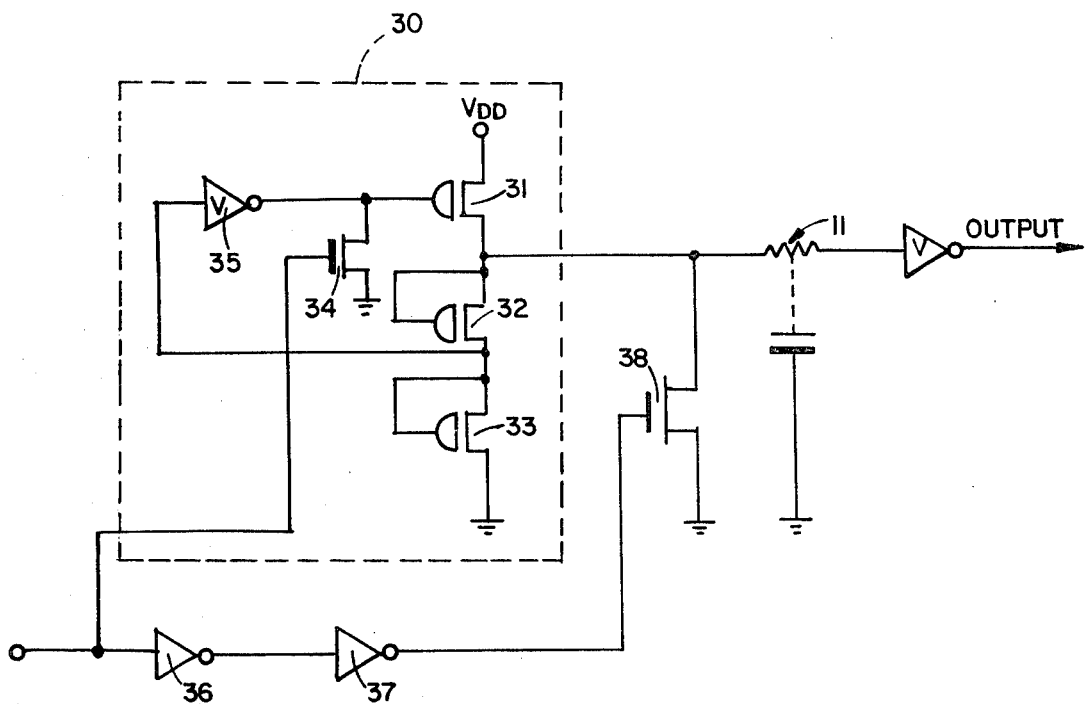
FIG. 5c is another embodiment of the RC delay circuit according to the present invention.

The present invention provides an RC delay circuit with an RC circuit with a sensing arrangement which eliminates some of the effects of process variations. Before turning to the specific embodiment of the present invention, it would be worthwhile to review the RC delay circuits known in the prior art.

FIG. 1 is a first example of a circuit known in the prior art which produces a fixed time delay. The circuits consists of a series of inverter stages. FIG. 1b is a schematic diagram of a MOS circuit which implements one of the inverter circuits used in the stage delay circuit shown in FIG. 1a.

FIG. 2 is a second RC delay type circuit known in the prior art based upon the configuration in FIG. 1 but featuring additional load capacitors.

FIG. 3a is a third circuit known in the prior art for producing a fixed time delay which is based upon the use of field effect transistors. FIG. 3b is a variation of the circuit shown in the FIG. 3a again using RC delays but in which a single long narrow pullup depletion effect is utilized.

FIG. 4a is another prior art fixed time delay circuit which again utilizes an RC delay making use of poly-resistors in a distributed RC circuit. FIG. 4b is a schematic form of the circuit depicted in FIG. 4a.

Turning next to FIG. 5a, there is shown an RC delay circuit according to the present invention. More particularly, the figure shows a signal input, MOS regulated voltage supply circuit 10 for supplying a voltage proportional to a predetermined trigger voltage, a distributed RC delay circuit 11 having a first input connected to the output of the regulated voltage circuit 10 and a second input connected to the signal input, and an output. A variable trigger point inverter 12 is provided which has an input connected to the output of the RC delay circuit, portion 11, and a signal output.

The input of the distributed RC delay circuit portion 11 is connected to the first conduction path terminal of an enhancement mode FET 38. The first conduction path terminal of FET 38 is also connected to the output of the regulated voltage circuit 10, and the other conduction path terminal connected to said relatively negative second source of electric potential. The control terminal of the FET 38 is connected to the signal input. A distributed RC delay circuit 11 has an output connected to the input of the variable trigger point inverter 12.

The detailed circuit diagram of the variable trigger point inverter 12 is shown in FIG. 5b. The Figure shows a source for supplying a relatively positive first ($V_{DD}$) and a relatively negative second (ground) source of electric potential to the circuit. The inverter 12 also includes a first depletion mode FET 13 having one conduction path terminal connected to the first source of electric potential $V_{DD}$, the other conduction path terminal connected to a first intermediate node 14, and its control terminal connected to the first intermediate node 14.

A first enhancement mode FET 15 is provided having one conduction path terminal connected to the first intermediate node 14, the other conduction path terminal connected to a second intermediate node 16, and its control terminal connected to the input of the inverter circuit.

A second enhancement mode FET 17 is provided having one conduction path terminal connected to said second intermediate node 16, the other conduction path terminal connected to said second source of potential (ground) and its control electrode connected to the input of the inverter circuit.

A second depletion mode FET 18 is provided having one conduction path terminal connected to said first source of electric potential, the other conduction path terminal connected to the second intermediate node 16 and its control terminal connected to the second intermediate node 16.

Returning once again to the description of FIG. 5a, the MOS regulated voltage supply circuit 10 includes means for supplying a relatively positive first ($V_{DD}$) and a relatively negative second (ground) source of electrical potential. A second variable trigger point inverter 35 having an input and an output is also provided in the regulated voltage supply 10. A first depletion mode FET 31 is provided which has one conduction path terminal connected to the first source of electric potential ($V_{DD}$), the other connection path terminal connected to the first input of the RC delay circuit, and a control terminal connected to the output of the second variable trigger inverter.

A second depletion mode FET 32 is provided which has one conduction path terminal connected to the first input of the RC delay circuit, the other conduction path terminal connected to a first intermediate node, and a control terminal connected to the first input of the RC delay circuit.

Finally, a third depletion mode FET 33 is provided having one conduction path terminal connected to the first intermediate node, the other conduction path terminal connected to the second source of electric potential (ground), a control terminal connected to the input of the second variable trigger inverter and the first intermediate node.

FIG. 5c is an alternative embodiment of the RC delay circuit according to the present invention. The basic difference in the embodiment of FIG. 5c from the embodiment of FIG. 5a is that an enhancement mode FET 34 is provided which has one conduction path terminal connected to the output of the second variable trigger point inverter and the control terminal of the depletion mode FET 31. The other conduction path terminal of the enhancement mode FET 34 is connected to the relatively negative second source of electric potential (ground). The control electrode of the enhancement FET 34 is connected to the signal input, as well as the input of a first inverter 36. The output of the first inverter 36 is connected to the input of a second inverter 37. The output of the second inverter 37 is connected to the control terminal of the enhancement mode field effect transistor 38. The circuit arrangement of FIG. 5c provides a faster fall time at the input of the RC delay circuit 11 which more closely approximates an ideal step input.

The distributed RC delay circuit 11 and the variable trigger point inverter 12 in FIG. 5c are essentially the same as in the embodiment of FIG. 5a. The regulated voltage supply 30 includes depletion mode FETs 31, 32, and 33 connected in the same manner as in the embodiment of FIG. 5a. The second variable trigger point inverter 35 is also provided connected in the same manner as in the embodiment of FIG. 5a.

Figure 6:
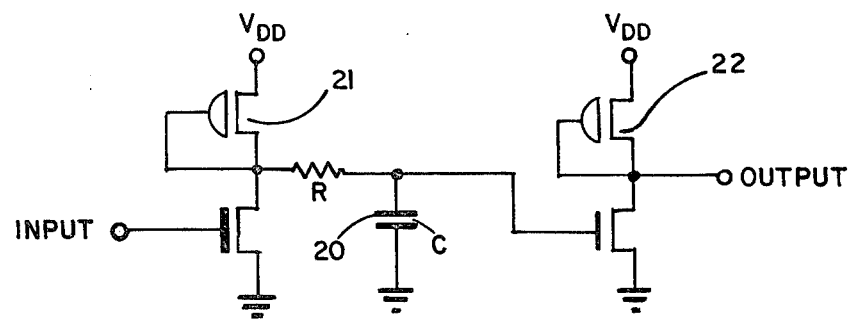
FIG. 6 is a prior art time delay circuit used for illustrating the drawbacks of the prior art.

Turning next to FIG. 6, there is shown a schematic diagram of a prior art time delay circuit related to the circuit of FIG. 4a which is used for illustrating the drawbacks of the prior art.

In order to illustrate the drawback of the prior art and explain the solution offered by the present invention, assume a fixed RC circuit 20 driven by and sensed by MOS inverters 21 and 22 respectively. Since fast rise times (step function input) are difficult to obtain, we shall assume that the capacitor C is initially charged and a step input is generated by a fast fall time.

Both $V_{DD}$ and the trigger point of the sense inverter can vary. The trigger point varies due to process parameters, thresholds, mobility, etc. The effect on the delay is shown in the waveforms in FIGS. 7a and 7b which represent the response of the circuit shown in FIG. 6 with different sets of process conditions, as calculated with a circuit model.

Figure 7A:
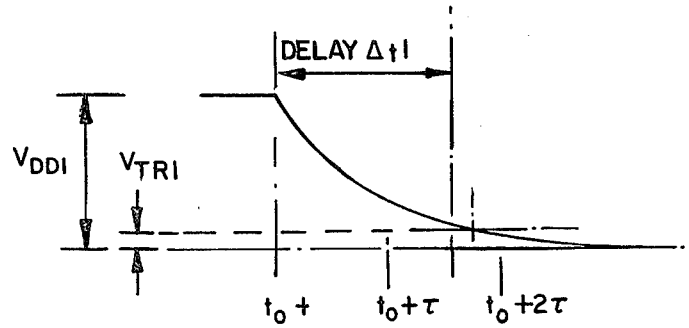
FIG. 7a and 7b are timing diagrams showing the variation of the time delay due to the variation in process parameters.
Figure 7B:
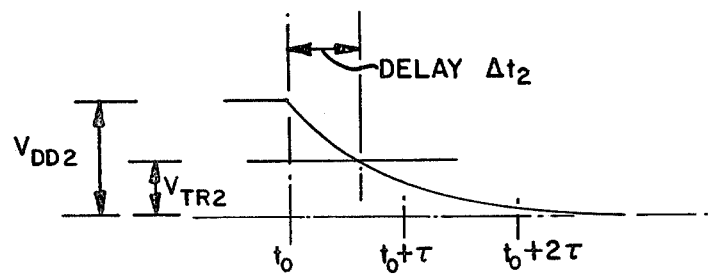

The difference in response may be computed as follows. Assume the following conditions (which are typical for n-channel devices):

$$V_{DD}(1-e^{-\Delta t/\tau})=V_{TR}\rightarrow\Delta t=-\tau\ln 1-(V_{TR}/V_{DD})$$

$$\Delta t_1=-\tau\ln 1-(1.0/5.5)=0.20\tau$$

$$\Delta t_2=-\tau\ln 1-(3.0/4.5)=1.10\tau$$

$$\Delta t_2/\Delta t_1=1.10/0.2=5.5$$

where $V_{DD}$ is a relatively positive source of electric potential, $V_{TR}$ is the trigger potential, $\Delta t$ is a variable time interval, $\tau=RC$ is a fixed time interval (for constant R and constant C), $\Delta t_1$ is the time delay shown in FIG. 7a associated with the circuit of FIG. 6 with one set of process conditions, and $\Delta t_2$ is the time delay shown in FIG. 7b associated with the circuit of FIG. 6 with a second set of process conditions.

Thus, in this example, the delay varies 5.5:1 without even taking variations of $\tau$ into account. Variations in $\tau$, input fall time (such as due to an imperfect step input) and additional logic stages associated with the use of the delay could cause the total system delay to amount to 8:1.

The present invention implements a circuit in which the ratio $V_{TR}/V_{DD}$ is constant. In the circuit according to the present invention, $V_{DD}$ is replaced by a regulated voltage supply that is proportional to the trigger voltage of the sensing inverter. The constant of proportionality r is fixed and is determined by a voltage divider. Since $$(d/dr)[\ln(1-r)] = 1/(r-1), r < 1,$$

in order to minimize variations in delay due to variations in r, r should be large (closer to 1). However, large r requires large $\tau$ for the same $\Delta t$. A value of $r = \frac{1}{2}$ was chosen. Thus, FETs 21, and 22 in FIG. 6 are identical sizes. The gates are connected to the drains to keep the FETs unsaturated and in the "resistive" region to make a good voltage divider. The trigger point is then chosen so that $2V_{TR} < V_{DD}$ min. (i.e. $V_{REG}$, supply max $< V_{DD\text{-}MIN}$, 4.3 v).

Figures 8A, 8B:
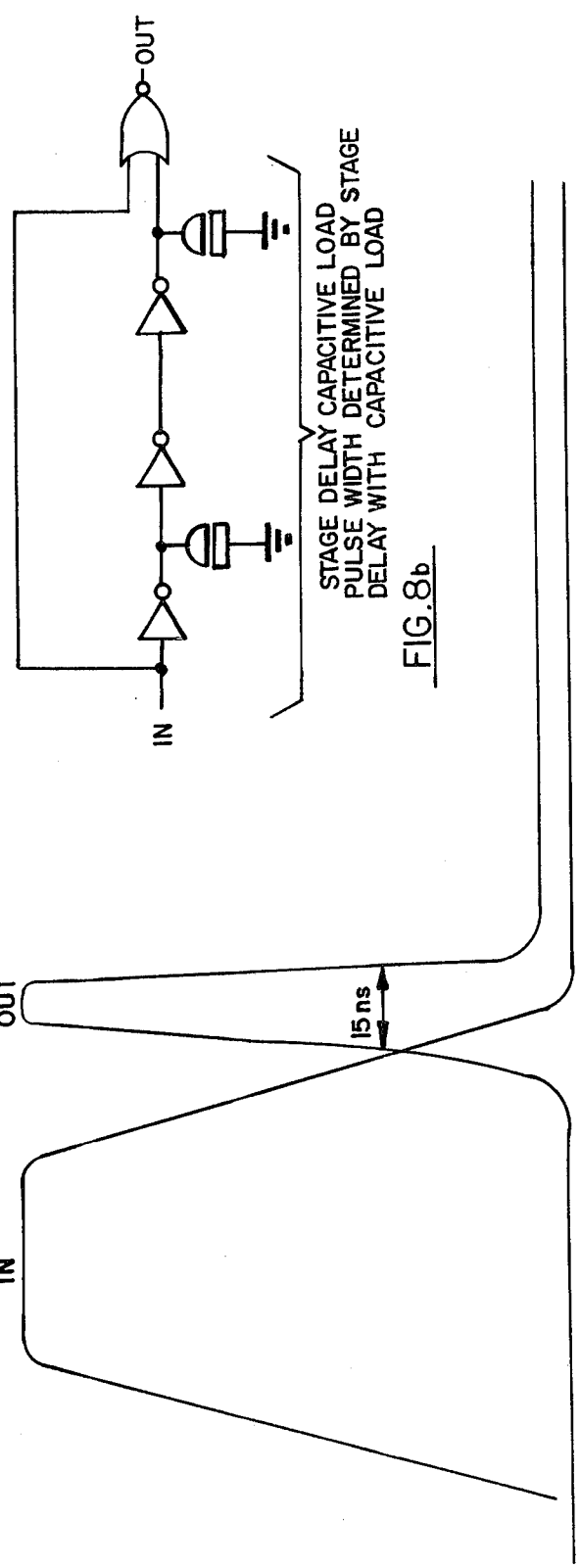
FIG. 8a is a timing diagram showing an input pulse applied to a stage delay circuit, and the output pulse associated therewith according to a first set of process parameters corresponding to high current, high speed.
FIG. 8b is a highly simplified schematic diagram of the stage delay circuit known in the prior art from which timing diagrams of FIGS. 8a and 8c are derived.

FIG. 8a is a timing diagram illustrating the pulse width by a stage delay in a delay circuit according to the prior art. The delay or pulse width of the output pulse is seen to be 15 nanoseconds with a first set of process parameters;

FIG. 8b is a highly simplified schematic diagram of the prior art stage delay capacitance load circuit from which measurements in FIGS. 8a and 8c are taken;

FIG. 8c is a timing diagram of the input pulse and the output pulse of the stage delay circuit of FIG. 8b with a second set of process conditions, corresponding to low current slow speed parameters. It is noted that under such process circumstances, the output pulse has a pulse width of 147 nanoseconds. The range of this prior art circuit is from 15 nanoseconds to 147 nanoseconds or 9.8:1.

Figure 9A:
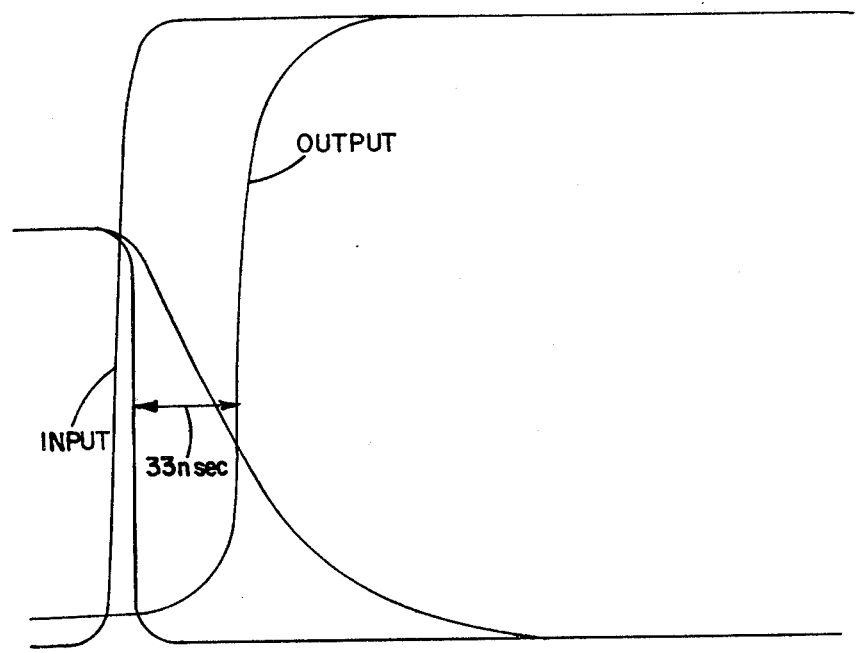
FIG. 9a is a timing diagram of the output of a time delay circuit of the present invention using high current, high speed process conditions.

FIG. 9a is a timing diagram of the output of the sensing inverter using the delay circuit according to the present invention. The process conditions for the circuit shown in FIG. 9a are high speed process conditions. The time delay from input to output is 33 nanoseconds.

Figure 9B:
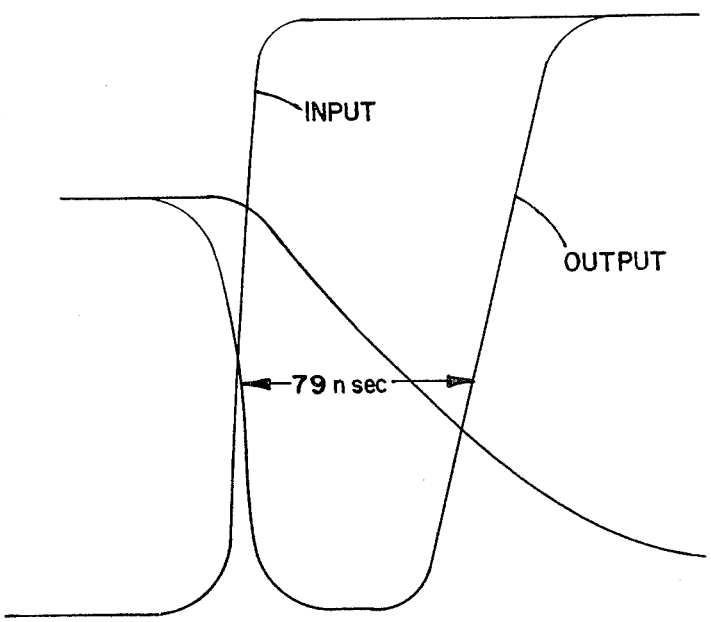
FIG. 9b is a timing diagram of the output of the stage delay circuit of the present invention using low current, low speed process conditions.

FIG. 9b is the corresponding timing diagram of the output of the sensing inverter with the time delay circuit according to the present invention in which the process inverters have been varied to be low current and high speed. The time delay from input to output is 79 nanoseconds.

Thus, the range of the time delay using the present invention is from 33 nanoseconds to 79 nanoseconds, or only 2.4:1, a significant improvement over prior art.

A more detailed analysis of the difference between polysilicon distributed RC circuits and FET RC circuits is worthwhile presenting at this point. It should be noted that there are different equations for the polysilicon distributed RC and the FET RC. The distributed RC embodiment has smaller variations due to process variations and is preferred.

The equations for a polysilicon distributed RC circuit are as follows:

$$R = (L/W) \times \rho_s,$$

where
L = poly line length (very long, ~100 mils)
W = poly linewidth $\rho_s$ = polysilicon sheet resistivity, $\Omega/\square$ $$C = W \times L \times C_o,$$

where
$C_o$ = gate oxide capacitance (in units pF/$\mu^2$)
L = poly line length (very long, ~100 mils)
W = poly linewidth $$RC = L^2 C_o \rho_s,$$

where
$L^2$ variation is negligible (~$2500\mu + 0.5\mu$)
$C_o$ does not vary with temperature, $C_o$ controlled to ~5%
$\rho_s$ does not vary with temperature, $\rho_s$ controlled to ~20%

(Note that the effective RC = $\frac{1}{2}$ RC since the RC is distributed).

The equations for a FET RC circuit are as follows:

$$R = \frac{1}{\mu C_o \frac{W_E}{L_E}(V_{GS} - V_T)}$$

where,
$\mu$ = effective channel mobility
$W_E$ = effective electrical width
$L_E$ = effective electrical length
$V_{GS}$ = gate to source voltage
$V_T$ = threshold voltage
$C_o$ = gate oxide capacitance $$C = L \times W \times C_o,$$

where,
L = geometric (drawn) length of the capacitor FET (second device)
W = geometric (drawn) width of the capacitor FET (second device)
$C_o$ = gate oxide capacitance $$RC = \frac{(L)(L_E)}{\mu(V_{GS} - V_T)}$$

if $W \cong W_E$ (for matched devices, $W_E \cong W \pm 0.5\mu$ so for large W, ~$25\mu$, $W_E \cong W$.)

Note that $L_E$ is not equal to polysilicon line width (L) due to lateral diffusion.

The best results (least variation) are obtained when the RC delay is a poly resistor with distributed capacitance. The effective $\tau$ is about $\frac{1}{2}$ RC where R and C are the total resistance and capacitance. Both $\rho_s$ and $C_o$ are independent of temperature. FETs may be used instead of a poly resistor if a larger variation can be tolerated.

The advantage is that the FET RC can be laid out in a smaller area than a long poly resistor. Variations occur in mobility ($\mu$), $V_{GS}$ and $V_T$. Variations in $LL_E$ can be made small by making $LL_E$ large.

While the invention has been illustrated and described as embodied in a MOS FIXED DELAY CIRCUIT, it is not intended to be limited to the details shown, since various modifications and structural changes may be made without departing in any way from the spirit of the present invention.

It will be obvious to those skilled in the art that the semiconductor circuit according to the present invention can be implemented with different semiconductor devices using various semiconductor technologies and different combinations of known process steps, and that the preferred embodiments illustrated here are merely exemplary. With respect to the semiconductor devices, the depth of penetration of the various zones and regions, and in particular the configuration and distance between the active zones of the transistor devices, as well as the concentrations of dopant species, and/or their concentration profiles, can be chosen depending upon the desired properties. These and other variations can be further elaborated by those skilled in the art without departing from the scope of the present invention.

The present invention is moreover not restricted to the particular embodiments of a MOS FIXED DELAY CIRCUIT described. For example, it may be pointed out that semiconductor materials other than silicon, for example, $A_{III}$-$B_V$ compounds may be used. Furthermore, the conductivity types in the embodiment may be interchanged and corresponding to such change, the polarity of the respective operating voltages adapted. Moreover, the voltage level and the static or dynamic nature of the signals applied to the various terminals and gates of the device, as well as the voltage sources, may be suitably selected as desired for a particular application. Other types of semiconductor devices including bipolar junction field effect transistor MNOS (metal electrode-silicon nitride, silicon oxide-semiconductor), MAOS (metal aluminum oxide, silicon oxide, semiconductor), MAS (metal, aluminum oxide, semiconductor), floating gate FETs, and AMOS FETs (avalanche MOS FETs), may be used as well.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A MOS time delay circuit comprising:
   a signal input;
   a MOS regulated voltage supply circuit for supplying a voltage proportional to a predetermined trigger voltage;
   a RC delay circuit having a first input connected to said regulated voltage supply circuit, and a second input connected to said signal input, and an output; and
   a first variable trigger point inverter having an input connected to the output of said RC delay circuit, and an output comprising means for supplying a relatively positive first and a relatively negative second source of electric potential to said circuit; a first depletion mode FET having one conduction path terminal connected to said first source of electric potential, the other conduction path terminal connected to a first intermediate node, at its control terminal connected to said first intermediate node; a first enhancement mode FET having one conduction path terminal connected to said first intermediate node, the other conduction path terminal connected to a second intermediate node, and its control terminal connected to the output of said RC delay circuit; a second enhancement mode FET having one conduction path terminal connected to said second intermediate node, the other conduction path terminal connected to said second source of potential, and its control electrode connected to said output of said RC delay circuit; and a second depletion mode FET having one conduction path terminal connected to said first source of electrical potential, the other conduction path terminal connected to said second intermediate node, and its control terminal connected to said second intermediate node.

2. A time delay circuit as defined in claim 1, wherein said MOS reguated voltage supply circuit comprises:
   means for supplying a relatively positive first and a relatively negative second source of electrical potential to said circuit;
   a second variable trigger point inverter having an input and an output;
   a first depletion mode FET having one conduction path terminal connected to said first source of electric potential, the other conduction path terminal connected to said first input of said RC delay circuit, and its control terminal connected to the output of said second variable trigger inverter;
   a second depletion FET having one conduction path terminal connected to said input of said RC delay circuit, the other conduction path terminal connected to a first intermediate node, and its control terminal connected to said input of said RC input circuit;
   a third depletion FET having one conduction path terminal connected to the first intermediate node, said second other path terminal connected to said second source of electric potential, control terminal connected to the input of said second variable trigger inverter and said first intermediate node.

* * * * *

UNITED STATES PATENT AND TRADEMARK OFFICE
CERTIFICATE OF CORRECTION

PATENT NO. : 4,430,587
DATED : February 7, 1984
INVENTOR(S) : Mark R. Tennyson

It is certified that error appears in the above-identified patent and that said Letters Patent are hereby corrected as shown below:

In column 5, line 11, in the equation, please delete "(r-1)" and insert --r - 1--.

In column 5, line 63, in the equation, please delete "(L/W)" and insert --L/W--.

In column 6, line 12, please delete "+" and insert --$\pm$--.

Signed and Sealed this

Seventeenth Day of July 1984

[SEAL]

Attest:

GERALD J. MOSSINGHOFF

Attesting Officer

Commissioner of Patents and Trademarks